(12) United States Patent
Abe

(10) Patent No.: US 6,969,911 B2
(45) Date of Patent: Nov. 29, 2005

(54) WIRING STRUCTURE OF SEMICONDUCTOR DEVICE AND PRODUCTION METHOD OF THE DEVICE

(75) Inventor: Kazuhide Abe, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 15 days.

(21) Appl. No.: 10/760,457

(22) Filed: Jan. 21, 2004

(65) Prior Publication Data

US 2005/0087871 A1  Apr. 28, 2005

(30) Foreign Application Priority Data

Oct. 24, 2003  (JP) ...................... 365238

(51) Int. Cl.[7] .................. H01L 23/48; H01L 23/52; H01L 29/40
(52) U.S. Cl. ............. 257/751; 257/211; 257/752; 257/758; 257/759; 257/760; 257/762; 257/763; 257/764; 257/766; 257/774
(58) Field of Search .............. 257/211, 751–752, 257/758–760, 762–764, 766, 774

(56) References Cited

U.S. PATENT DOCUMENTS

| | | | | |
|---|---|---|---|---|
| 4,910,580 A | * | 3/1990 | Kuecher et al. | ............ 257/751 |
| 4,933,743 A | * | 6/1990 | Thomas et al. | ............ 257/742 |
| 4,970,574 A | * | 11/1990 | Tsunenari | .................... 257/753 |
| 6,150,720 A | * | 11/2000 | Yamaha et al. | ............. 257/751 |
| 6,177,701 B1 | * | 1/2001 | Matsumoto | ................. 257/310 |
| 6,674,170 B1 | * | 1/2004 | Ngo et al. | .................... 257/774 |
| 6,680,514 B1 | * | 1/2004 | Geffken et al. | ............. 257/368 |
| 6,720,657 B2 | * | 4/2004 | Suguro | ....................... 257/758 |
| 2002/0093035 A1 | * | 7/2002 | Jin et al. | ..................... 257/208 |
| 2005/0087872 A1 | * | 4/2005 | Abe | ........................... 257/751 |

FOREIGN PATENT DOCUMENTS

| | | |
|---|---|---|
| JP | 07-122642 | 5/1995 |
| JP | 10-261635 | 9/1998 |
| JP | 2000-323479 | 11/2000 |
| JP | 2002-329780 | 11/2002 |
| JP | 2003-179000 | 6/2003 |

* cited by examiner

*Primary Examiner*—Mary Wilczewski
*Assistant Examiner*—Ida M. Soward
(74) *Attorney, Agent, or Firm*—Volentine Francos & Whitt, PLLC

(57) ABSTRACT

In a wiring structure of a semiconductor device, dielectric tolerance of the wiring is improved by preventing diffusion of the wiring material. The wiring structure of the semiconductor device includes a first insulating film having plural grooves, plural wiring films formed protrusively above tops of the first insulating film among the grooves, plural barrier films formed on bottoms of the wiring films and up to a higher position than the tops on sides of the wiring films, first cap films including metal films formed on tops of the wiring films, and a second cap film formed on at least respective sides of the first cap films and the barrier films.

16 Claims, 12 Drawing Sheets

WIRING STRUCTURE OF SEMICONDUCTOR DEVICE AND PRODUCTION METHOD OF THE DEVICE

BACKGROUND OF THE INVENTION

1. Field of the Invention

The present invention relates to a wiring structure of a semiconductor device and a production method of the device.

2. Description of the Related Art

With progress of miniaturization of the semiconductor device, influence of RC delay (signal delay caused by resistance and capacitance) becomes serious, or becomes a great reason that hinders speed-up of the device operation. To reduce the resistance of the wiring and interconnect capacitance, wiring using copper Cu instead of an aluminum alloy is introduced in a semiconductor device having a wiring width of 0.25 μm or less. Since dry etching is generally difficult in formation of the wiring using Cu, the Damascene method, in which Cu is deposited into grooves for wiring formed on an insulating film and then planarized, is used.

In the formation of the Cu wiring using the Damascene method, the grooves for wiring are formed on a first insulating film, then a barrier film for preventing Cu diffusion and a Cu wiring film are deposited in order in the grooves, and then surfaces are planarized using the chemical mechanical polishing (CMP) method, and the Cu wiring film and the barrier film are left in the grooves. Subsequently, a cap film comprising silicon nitride $Si_xN_y$ is deposited on the Cu wiring film. This is because Cu is easily oxidized and thus a silicon oxide film can not be directly deposited on the Cu wiring film, therefore the Cu wiring film needs to be covered by the silicon nitride film. However, when an insulating film such as the $Si_xN_y$ is used as the cap film, adhesiveness between the cap film that is the insulating film and the Cu wiring film that is a metal film is bad, and electromigration is apt to occur at a boundary surface between the cap film and the Cu wiring film. Therefore, a method in which the Cu wiring film is selectively coated by a metal film such as CoWP or CoWB film instead of covered by the insulating film is proposed.

The wiring structure in which the Cu wiring film is coated by the metal film is, for example, described in the patent literature 1. In this wiring structure, the barrier film and the Cu wiring film are embedded in the grooves for wiring formed on the first insulating film, then a conductive film (cap film) containing cobalt Co or nickel Ni as a main component is selectively formed on the Cu wiring film by electroless plating, and then $Co_xSi_yP_z$ or $Ni_xSi_yP_z$ is deposited on the cap film by the electroless plating and made into silicide, thereby an oxidation prevention film is formed.

A wiring structure in which diffusion of Cu ions or spreading of Cu hillocks due to the electromigration are restrained is described in the patent literature 2. In the wiring structure, although the Cu wiring films are embedded in the grooves for wiring on the first insulating film via the barrier films, the Cu wiring films and the barrier films are formed protrusively above the grooves. A cap film comprising an insulating film such as silicon carbide $Si_xC_y$ is formed on an entire surface such that the cap film covers the Cu wiring films and the barrier films protruded from the grooves for wiring. In the wiring structure, top edges of the Cu wiring films that are leakage sources of the wiring material are separated vertically from boundary faces of the first insulating film that are leakage current paths.

Patent Document 1
JP-A-2003-179000 (FIG. 1 on page 5)
Patent Document 2
JP-A-2002-329780 (FIG. 20 on page 15)

In the wiring structure described in the patent literature 1, the top edges of the Cu wiring films that are the leakage sources of the wiring material are close to the boundary faces of the first insulating film that are the leakage current paths through boundary faces between the cap film and the barrier films, and the Cu ions easily reach the leakage current paths through the boundary faces between the cap film and the barrier films, and thus the leakage current may flow into the adjacent Cu wiring films.

In the wiring structure described in the patent literature 2, although the top edges of the Cu wiring films that are the leakage sources of the wiring material are separated vertically from the boundary faces of the first insulating film that are the leakage current paths, since the cap film formed on the Cu wiring films is an insulating film, adhesiveness at the boundary faces between the Cu wiring films and the cap film or at the boundary faces between the barrier films and the cap film is bad. The electromigration is apt to occur on the tops of the Cu wiring films due to the bad adhesiveness at the boundary faces between the Cu wiring films and the cap film, and when influence of the electromigration is large, the Cu ions or the Cu hillocks may reach the boundary faces of the first insulating film that are the leakage current paths from the top edges of the Cu wiring films through the boundary faces between the barrier films and the cap film at which the adhesiveness is bad, resulting in increase of the leakage current or an interconnect short-circuit.

SUMMARY OF THE INVENTION

The invention aims to improve dielectric tolerance of the wiring by preventing the diffusion of the wiring material in the wiring structure of the semiconductor device.

The wiring structure of the semiconductor device according to the invention has a first insulating film, plural wiring films, plural barrier films, first cap films, and a second cap film. Plural grooves are formed on the first insulating film. The first insulating film has horizontal boundary faces among the adjacent grooves. The wiring films are formed protrusively above the boundary faces of the first insulating film for each of grooves on the first insulating film. The barrier films are formed on bottoms of the wiring films and up to a higher position than the boundary faces on sides of the wiring films. The first cap films are selectively formed on tops of the wiring films. The second cap film is formed on at least respective sides of the first cap films and the barrier films.

In the wiring structure of the semiconductor device according to the invention, since the top edges of the wiring films that are the leakage sources of the wiring material are separated vertically from the boundary faces of the first insulating film that are the leakage current paths for the wiring material, the leakage current hardly reaches the boundary faces of the first insulating film that are the leakage current paths even if the wiring material is leaked. Moreover, the adhesiveness between the first cap films that are the metal films and the wiring films is high, therefore occurrence of the electromigration is restrained on the tops of the wiring films, and leakage of the wiring material itself can be restrained. As a result, the interconnect leakage current can be restrained, and an electrical interconnect short-circuit can be prevented, resulting in improvement of the dielectric tolerance of the wiring.

DESCRIPTION OF THE PREFERRD EMBODIMENTS

1. First Embodiment

Configuration

Figure 9:
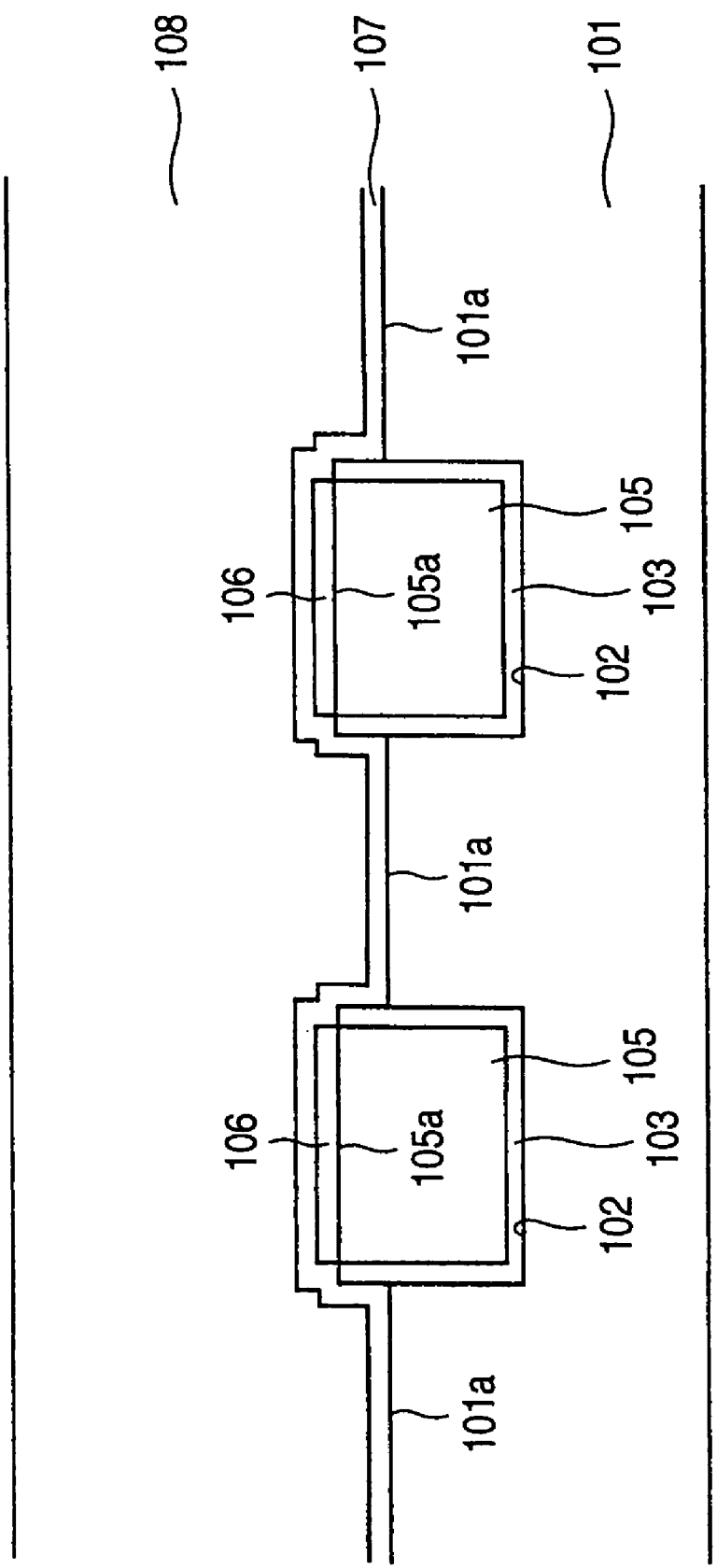
FIG. 9 is a view I describing the production method of the wiring structure according to the first embodiment.

FIG. 9 is a section view of a wiring structure 1 according to the first embodiment of the invention. The wiring structure 1 has an insulating film 101, plural barrier films 103, plural wiring films 105 comprising cupper Cu or a copper alloy, first cap films 106 comprising metal films containing cobalt Co as a main component such as $Co_xW_yP_z$, Co, or $Co_xMo_yP_z$, or metal films containing nickel Ni as the main component such as $Ni_xW_yP_z$ or $Ni_xMo_yP_z$, and a second cap film 107 comprising an insulator containing $Si_xN_y$, $Si_xO_yN_z$, or $Si_xC_y$ as the main component.

Plural grooves 102 (grooves for wiring) are formed on a surface of the insulating film 101. Moreover, the insulating film 101 has boundary faces 101a as horizontal tops among the adjacent grooves 102. The wiring films 105 are formed for each of the grooves 102 on the insulating film 101. The wiring films 105 are formed protrusively above the boundary faces 101a of the insulating film 101 in a convex pattern, or the boundary faces 105a of the wiring films 105 are positioned above the boundary faces 101a. Therefore, edges of the tops 105a of the wiring films 105 are separated vertically from the boundary faces 101a. The barrier films 103 are formed on bottoms of the wiring films 105 and up to a higher position than the boundary faces 101a on sides of the wiring films 105. The cap films 106 are formed selectively on the tops 105a of the wiring films 105. The cap film 107, which covers respective tops and sides of the cap films 106 and the barrier films 103, is formed on an entire surface. A second insulating film 108 is formed on the cap film 107.

Production Method

Hereinafter, a production method of the wiring structure 1 is described with reference to FIG. 1 to FIG. 9.

Figure 1:
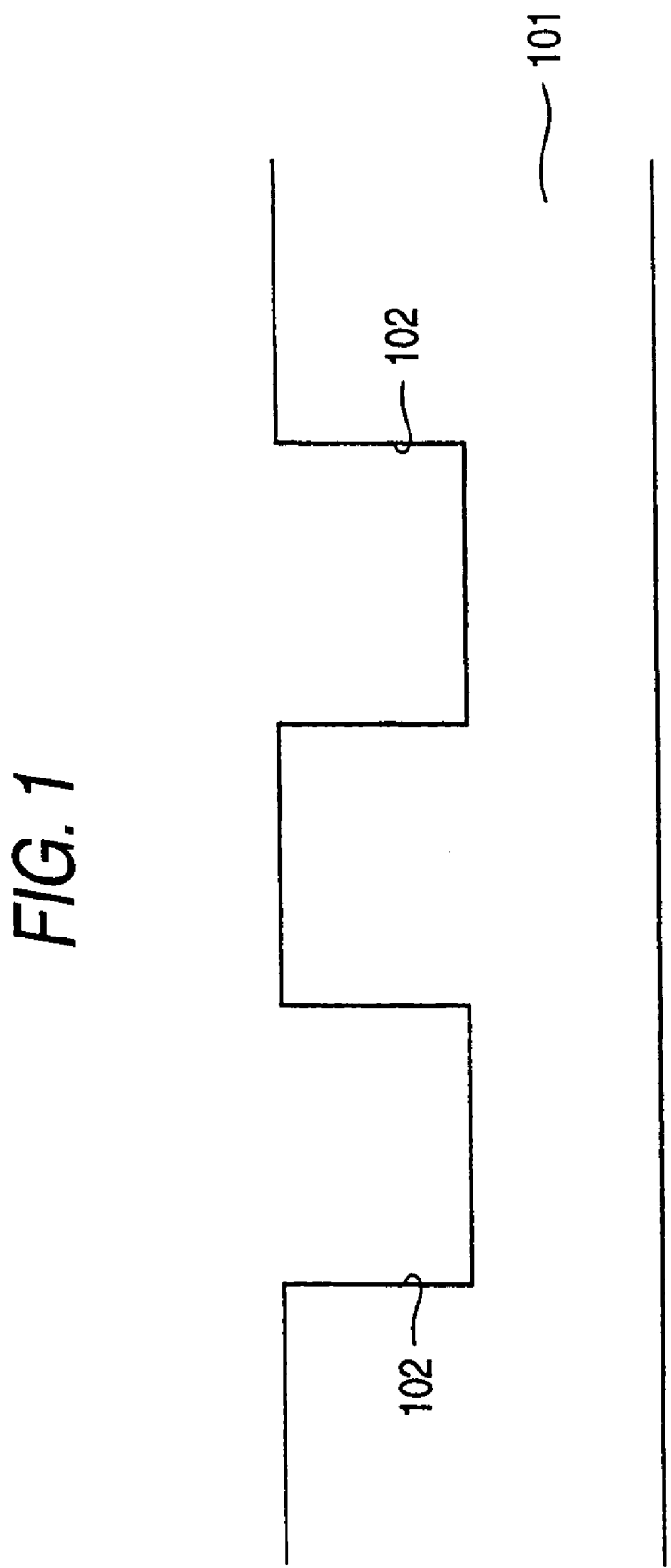
FIG. 1 is a view A describing a production method of a wiring structure according to the first embodiment.

As shown in FIG. 1, the insulating film 101 comprising silicon oxide $SiO_2$ is formed 500 nm in thickness on a substrate (not shown) on which a semiconductor device is formed using CVD method, and the plural grooves 102 are formed in a predetermined area for wiring formation (area for forming a wiring pattern) by the photolithography etching. The grooves 102 are 200 nm in width and 350 nm in depth, and the interval among the adjacent grooves 102 is 200 nm. The grooves 102 are etched, for example, using magnetron type reactive ion etching (RIE) apparatus. For etching the insulating film 101, etching apparatus suitably selected from magnetron type cathode coupled etching apparatus, double-channel excited, capacitively-coupled plasma etching apparatus, and ICP (Inductive coupled plasma) type etching apparatus can be preferably used. Etching gases used in the etching of the insulating film 101 are octafluorocyclobutane $C_4F_8$, carbon monoxide CO, oxygen $O_2$, and argon Ar. The etching conditions are a gas flow rate of $C_4F_8/CO/O_2/Ar=14/50/5/30$ sccm, an RF power of 1.5 kW, and a chamber pressure of 50 mTorr.

Figure 2:
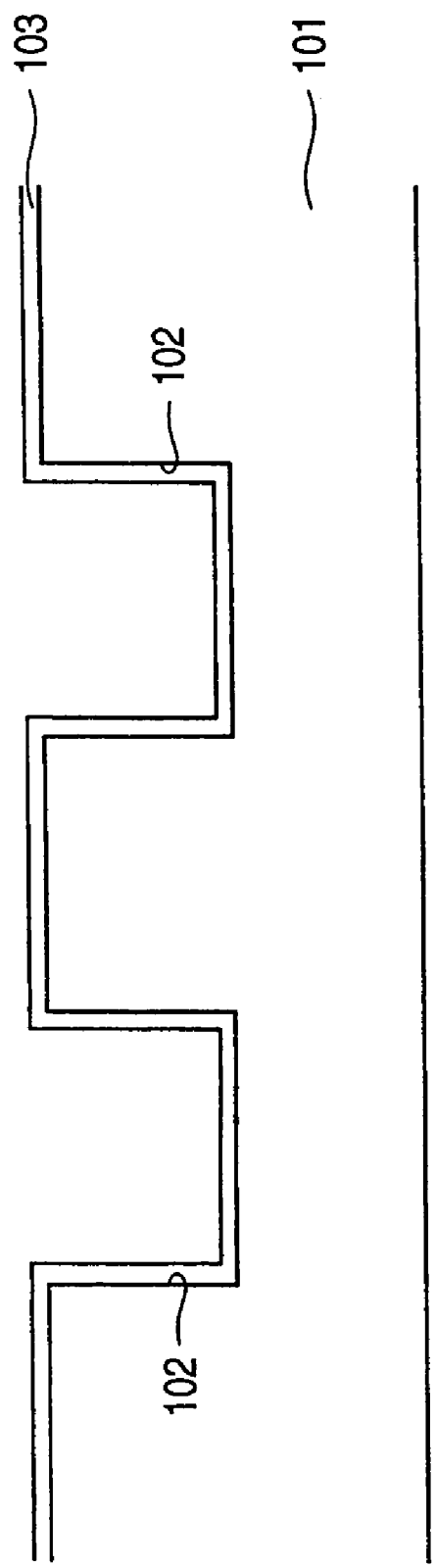
FIG. 2 is a view B describing the production method of the wiring structure according to the first embodiment.

Next, as shown in FIG. 2, a barrier film 103 comprising tantalum nitride TaN is formed 50 nm in thickness on the insulating film 101. Specifically, the barrier film 103 is formed on inner surfaces (bottoms and sides) of the grooves 102 on the insulating film 101 and surfaces of the insulating film 101. In the formation of the barrier film 103, for example, Ta as the target, and $Ar/N_2$ mixed gas as the process gas are used, and the tantalum nitride TaN is deposited by highly directional sputtering in conditions of an atmospheric pressure of 3 mTorr, a deposition temperature of 150° C., and a DC power of 6 kW. The barrier film 103 is not limited to the tantalum nitride TaN, and can be formed using a material having a similar function of preventing the Cu diffusion, for example, a conductive material including a metal film containing tantalum as the main component such as Ta or $Ta_xSi_yN_z$, a metal film containing titanium as the main component such as $Ti_xN_y$ or $Ti_xSi_yN_z$, or a metal film containing tungsten as the main component such as $W_xN_y$ or $W_xSi_yN_z$.

Figure 3:
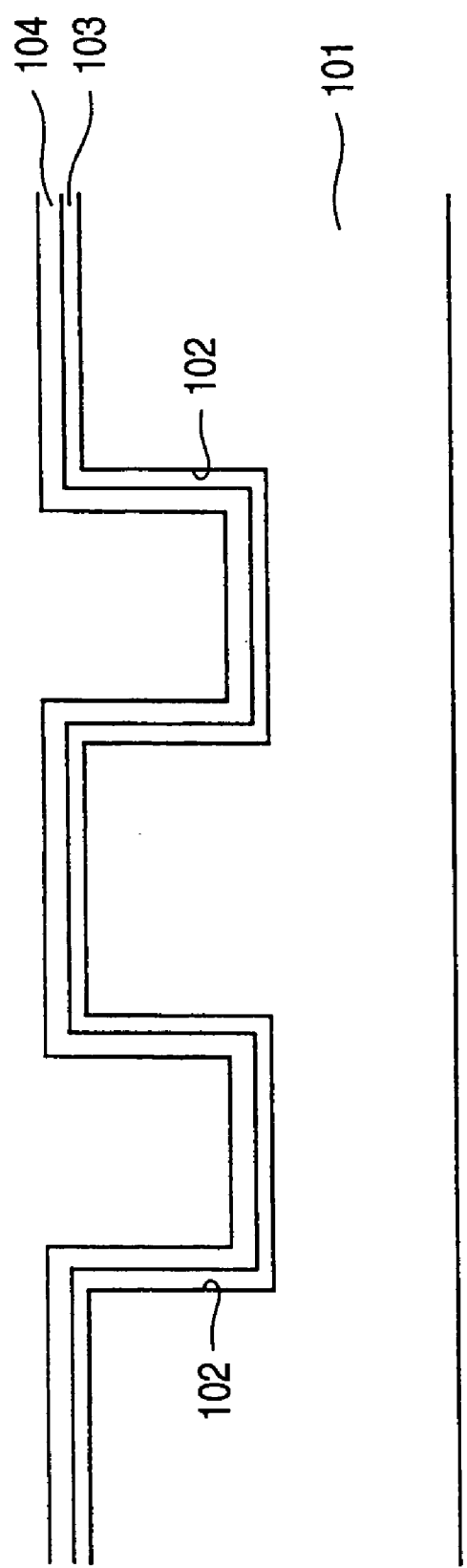
FIG. 3 is a view C describing the production method of the wiring structure according to the first embodiment.

Next, as shown in FIG. 3, a Cu seed film 104 that is the seed of the plating film is formed 150 nm in thickness on a surface of the barrier film 103. In the formation of the Cu seed film 104, for example, Cu as the target and Ar as the process gas are used, and Cu is deposited by the highly directional sputtering in conditions of an atmospheric pressure of 2 mTorr, a deposition temperature of 30° C., and DC power of 12 kW. The Cu seed film 104 can be a Cu film or an alloy film containing Cu as the main component.

Figure 4:
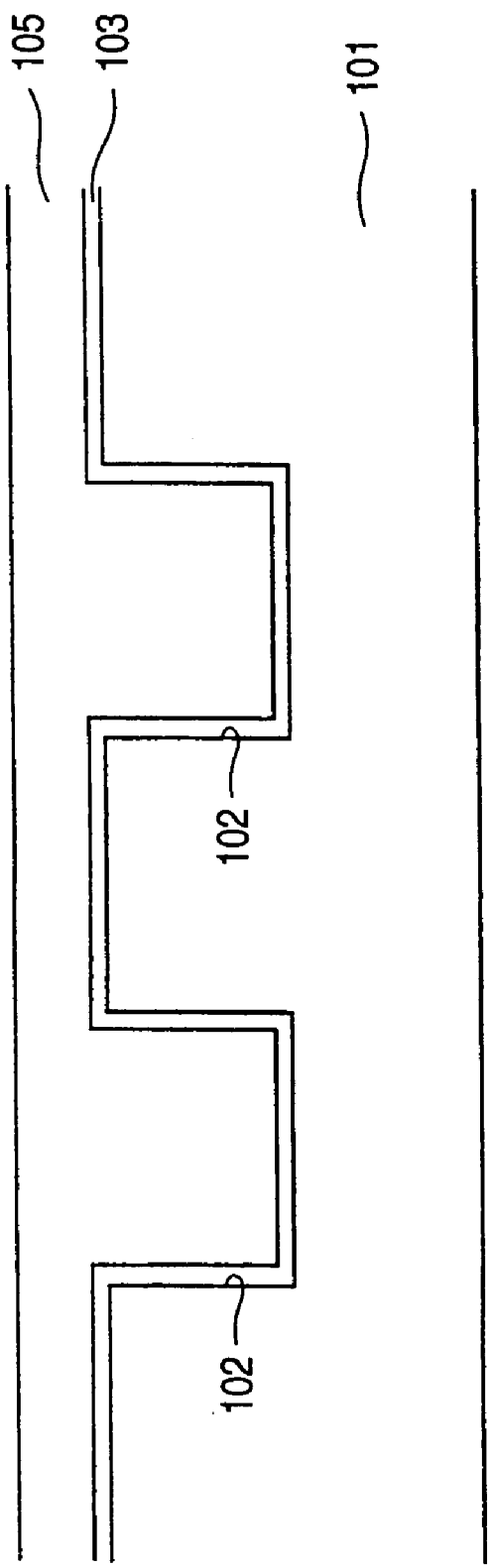
FIG. 4 is a view D describing the production method of the wiring structure according to the first embodiment.

Next, as shown in FIG. 4, a wiring film 105 comprising Cu is deposited on a surface of the Cu seed film 104 using electroplating method. Although it is sufficient that the wiring film 105 is deposited in only an enough thickness to fill the grooves 102 or more, here, the wiring film 105 is deposited up to a position several hundreds nanometers higher than the surface of the insulating film 101. For the electroplating, for example, a plating solution containing copper sulfate $CuSO_4.5H_2O$ as the source of Cu component precipitation, sulfuric acid $H_2SO_4$ for improving conductivity, chlorine Cl for accelerating glossiness of a high electric-current density portion or solubility of a soluble anode (for example, phosphor contained copper), and additives for improving embedding performance is used. For example, the electroplating is performed using the plating solution in conditions of a solution temperature of 25° C. and a constant current with two switchable electric current densities. The electric current density is switched, for example, in such a way that a low electric current density of 0.2 $A/dm^2$ is used in the first stage and a high electric current density of 2 A/dm$^2$ is used in the second stage. The reason for changing the electric current density in two stages in such way is that electroplating at the high electric current density only may cause closing of the plating film (wiring film 105) at entrances of the grooves 102 that are finely patterned, which in turn causes formation of voids, on the other hand, electroplating at the low electric current density only causes slow deposition rate of the wiring film 105, therefore requires much time to fill the grooves 102. In the following description, the name of wiring film 105 is assumed to include the Cu seed film 104.

The wiring film 105 is electroplated, then subjected to heat treatment, for example, at a temperature of 100 to 350° C. in a mixed atmosphere of nitrogen $N_2$ and hydrogen $H_2$ for 1 to 300 min in an oven. Alternatively, the heat treatment can be performed with the substrate being placed on a hotplate. The heat treatment is to accelerate growth of the fine Cu crystal grain in the wiring film 105 and stabilize hardness, crystallinity, and resistivity of the film.

Figure 5:
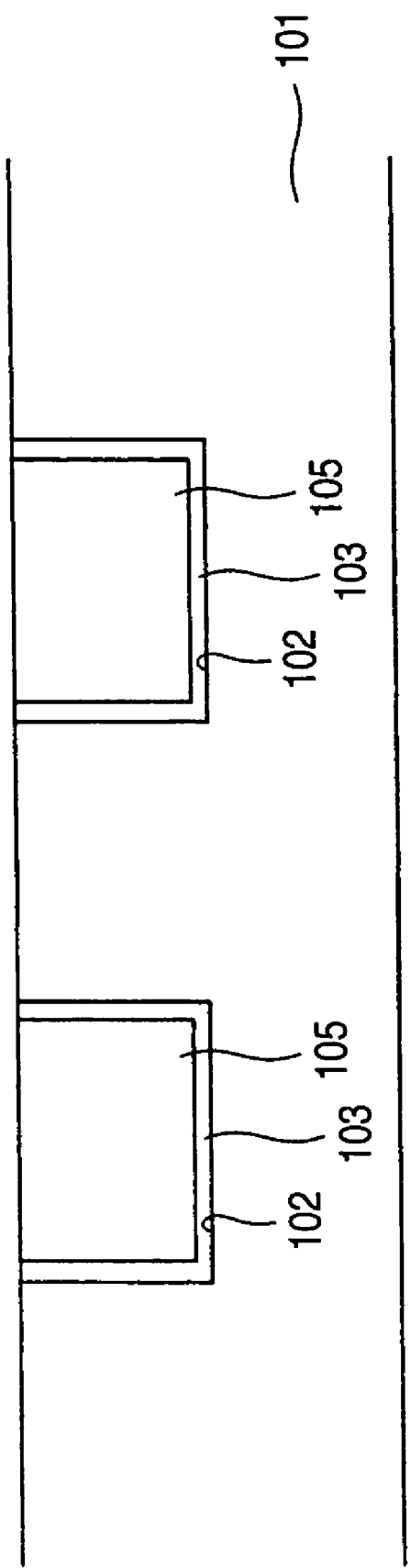
FIG. 5 is a view E describing the production method of the wiring structure according to the first embodiment.

Next, as shown in FIG. 5, the wiring film 105 and the barrier film 103 are polished using CMP method, thereby the wiring film 105 and the barrier film 103 are planarized. More specifically, the wiring film 105 and the barrier film 103 are removed until the insulating film 101 is exposed and left only in the grooves 102. As a result, respective tops of the wiring films 105 and the barrier films 103 are in a same level with the surface of the insulating film 101.

The polishing by CMP includes, for example, two polishing stages. In the first stage, the wiring film 105 is polished and removed until the surface of the barrier film 103 on the surface of the insulating film 101 is exposed using the barrier film 103 as a stopper. In the first stage, a solution containing silica as a polishing particle material to which hydrogen peroxide $H_2O_2$ is added as a copper complex formation accelerator is used as slurry. A stacked structure of a nonwoven fabric and a closed cell foam is used as a polishing pad, and a slurry flow rate is set to 200 ml/min, a polishing load is set to 2 psi, a carrier head rotation frequency is set to 120 rpm, and a table rotation frequency is set to 120 rpm. Subsequently in the second stage, the barrier film 103 on the surface of the insulating film 101 is removed using the insulating film 101 as the stopper. Again in the second stage, the solution containing the silica as the polishing particle material to which the hydrogen peroxide $H_2O_2$ is added is used as the slurry. The stacked structure of the nonwoven fabric and the closed cell foam is used as the polishing pad, and the slurry flow rate is set to 200 ml/min, the polishing load is set to 2 psi, the carrier head rotation frequency is set to 80 rpm, and the table rotation frequency is set to 80 rpm.

Figure 12:
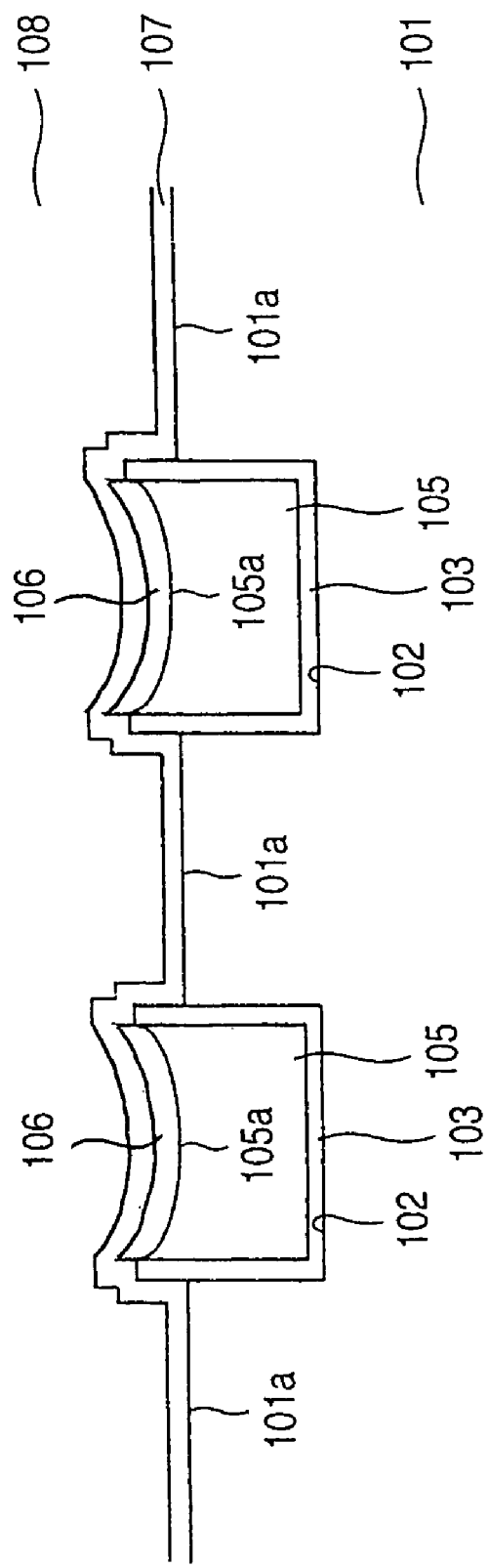
FIG. 12 is a view showing a shape of wiring films 105 affected by dishing.

In the planarization of the wiring film 105 and the barrier film 103, it is ideally preferable that the tops of the wiring films 105 and tops of the barrier films 103 are in a same level, actually, since dishing occurs in removing the barrier film 103 (the second polishing stage), that is, the wiring films 105 in the grooves 102 are more polished than the barrier films 103 as shown in FIG. 12, the tops 105a of the wiring films 105 are lowered at their center only by 5 nm to 10 nm with respect to the tops of the barrier films 103. Again in this case, the tops 105a of the wiring films 105 that are the leakage sources of the Cu ions or Cu hillocks are protruded above the boundary faces 101a of the insulating film 101 by reducing the thickness of the insulating film 101 described later.

Figure 6:
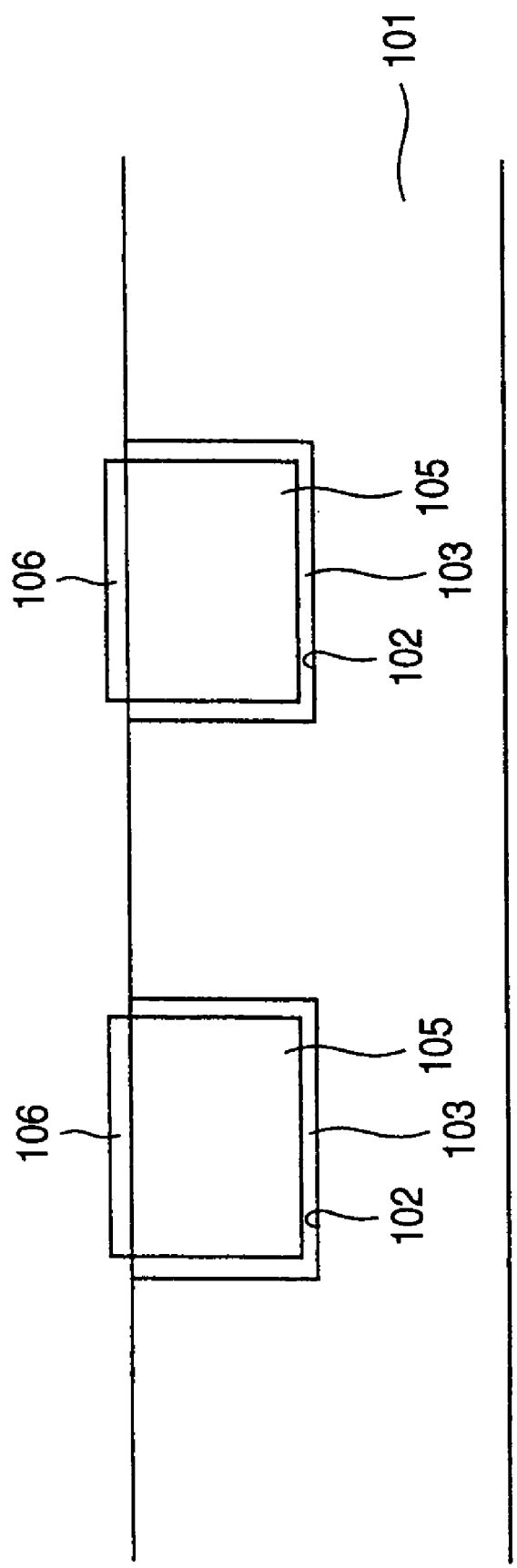
FIG. 6 is a view F describing the production method of the wiring structure according to the first embodiment.

Next, as shown in FIG. 6, first cap films 106 are formed on the wiring films 105. The cap films 106 are formed, for example, by depositing cobalt-tungsten-phosphor $Co_xW_yP_z$ 20 nm in thickness by electroless plating. An example of procedure of the electroless plating is as follows. First, a pretreatment for forming a catalytically active layer on surfaces of the wiring films 105 is performed. In the pretreatment, a wafer surface on which the wiring films 105 are exposed is dipped in a palladium chloride solution, thereby Cu atoms are substituted by Pd atoms at the most upper surfaces (tops) of the wiring films 105, and thereby the catalytically active layer is formed. Since Pd has less ionization tendency than Cu, Pd substitution plating occurs at the surfaces of the wiring films 105. After the catalytically active layer is formed, $Co_xW_yP_z$ is deposited by the electroless plating. The $Co_xW_yP_z$ is deposited only on an area where Pd as the catalytically active layer is present, and the catalytically active layer with Pd is formed only on the tops of the wiring films 105, therefore the $Co_xW_yP_z$ films (cap films 106) are formed only on the tops of the wiring films 105.

Although the cap films 106 are described to be metal films comprising $Co_xW_yP_z$, the cap films 106 can be metal films containing Co as the main component such as Co, $Co_xP_y$, or $Co_xMo_yP_z$, or metal films containing nickel Ni as the main component such as $Ni_xW_yP_z$ or $Ni_xMo_yP_z$.

Figure 7:
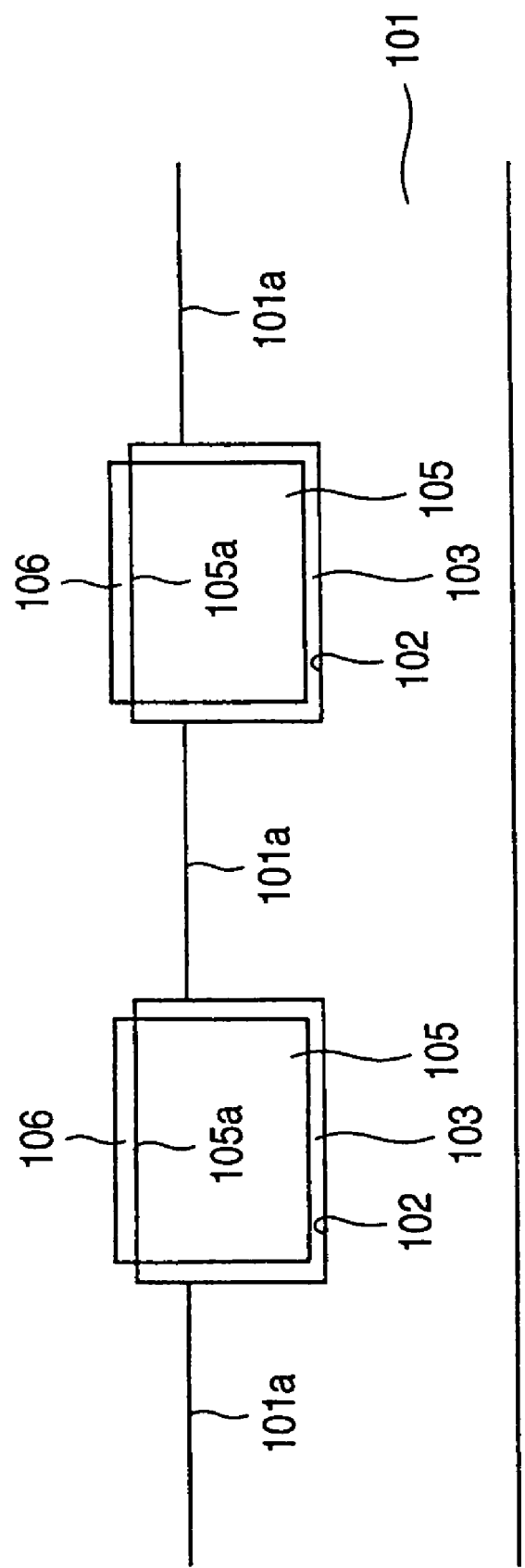
FIG. 7 is a view G describing the production method of the wiring structure according to the first embodiment.

Next, as shown in FIG. 7, the insulating film 101 is etched using the cap films 106 as a mask to have a reduced thickness, and the barrier films 103 and the wiring films 105 are protruded above the boundary faces 101a of the insulating film 101. From this, the edges of the tops 105a of the wiring films 105 are separated vertically from the boundary faces 101a. The thickness reduction of the insulating film 101 is performed, for example, by removing the insulating film 101 by 20 nm in thickness. Etching gases used for etching the insulating film 101 are $C_4F_8$, CO, $O_2$, and Ar. The etching conditions are, for example, a gas flow rate of $C_4F_8$/CO/$O_2$/Ar=14/50/5/30 sccm, a chamber pressure of 50 mTorr, and an RF power of 1.5 kW. The etching of the insulating film 101 is not limited to dry etching, and wet etching using hydrofluoric acid (0.3% HF) chemical can be also used.

Figure 8:
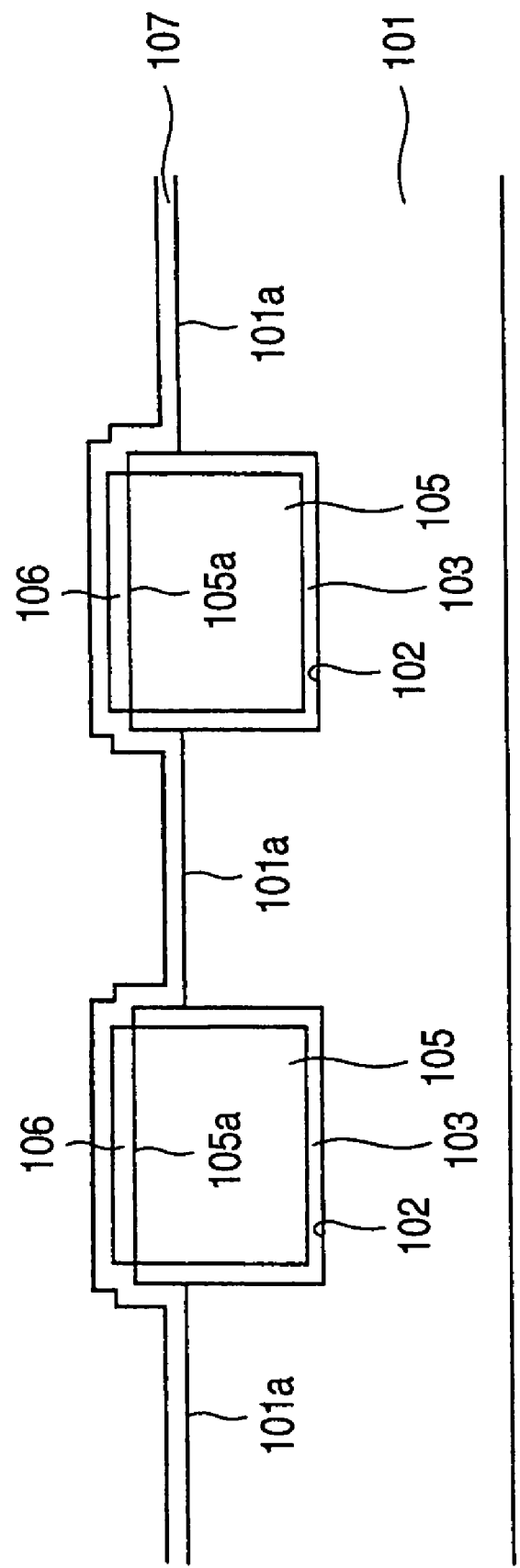
FIG. 8 is a view H describing the production method of the wiring structure according to the first embodiment.

Next, as shown in FIG. 8, a second cap film 107 comprising $Si_xN_y$ is deposited 50 nm in thickness using the CVD method. Material for the cap film 107 is not limited to $Si_xN_y$, $Si_xC_y$, $Si_xO_yN_z$, or an insulating film containing $Si_xC_y$ as the main component can be used. Next, as shown in FIG. 9, an insulating film 108 comprising the silicon oxide $SiO_2$ is deposited 700 nm in thickness using the CVD method.

Operational Advantages

In the wiring structure 1 according to the embodiment, since the edges of the tops 105a of the wiring films 105 that are the leakage sources of the Cu ions or the Cu hillocks are spaced vertically from the boundary faces 101a of the insulating film 101 that are the leakage current paths, the Cu ions or the Cu hillocks hardly reach the boundary faces 101a of the insulating film from the edges of the tops 105a of the wiring films 105. Further, since the tops 105a of the wiring films 105 are covered by the cap films 106 comprising the metal films, adhesiveness at the boundary faces between the wiring films 105 and the cap films 106 or at the tops 105a of the wiring films 105 is high, thereby the electromigration can be restrained at the tops 105a of the wiring films 105. Moreover, since respective sides of the wiring films 105 and the barrier films 103 are covered by the second cap film 107 having a large insulating effect, the interconnect leakage current among the adjacent wirings can be restrained, resulting in improvement of the dielectric interconnect tolerance.

The cap films 106 comprising $Co_xW_yP_z$ are hardly deposited on the barrier films 103, and thus entering of oxygen may occur at the edges of the tops 105a of the wiring films 105 that are boundaries with the barrier films 103, however, the edges of the tops 105a of the wiring films 105 are covered by the second cap film 107, thereby oxidization of the wiring films 105 from the edges of the tops 105a can be prevented.

When the wiring films 105 and the barrier films 103 are polished and planarized using the CMP method in the process shown in FIG. 5, as shown in FIG. 12, in some cases the tops 105a of the wiring films 105 is lowered at their center by 5 nm to 10 nm with respect to the tops of the barrier films 103. Even in such case, the tops 105a of the wiring films 105 that are the leakage sources of the Cu ions or the Cu hillocks are protruded above the boundary faces 101a of the insulating film 101 that are the leakage current paths, and the edges of the tops 105a of the wiring films 105 are separated vertically from the boundary faces 101a, therefore the Cu ions or the Cu hillocks hardly reach the boundary faces 101a of the insulating film 101 from the tops 105a of the wiring films 105.

2. Second Embodiment

Configuration

Figure 11:
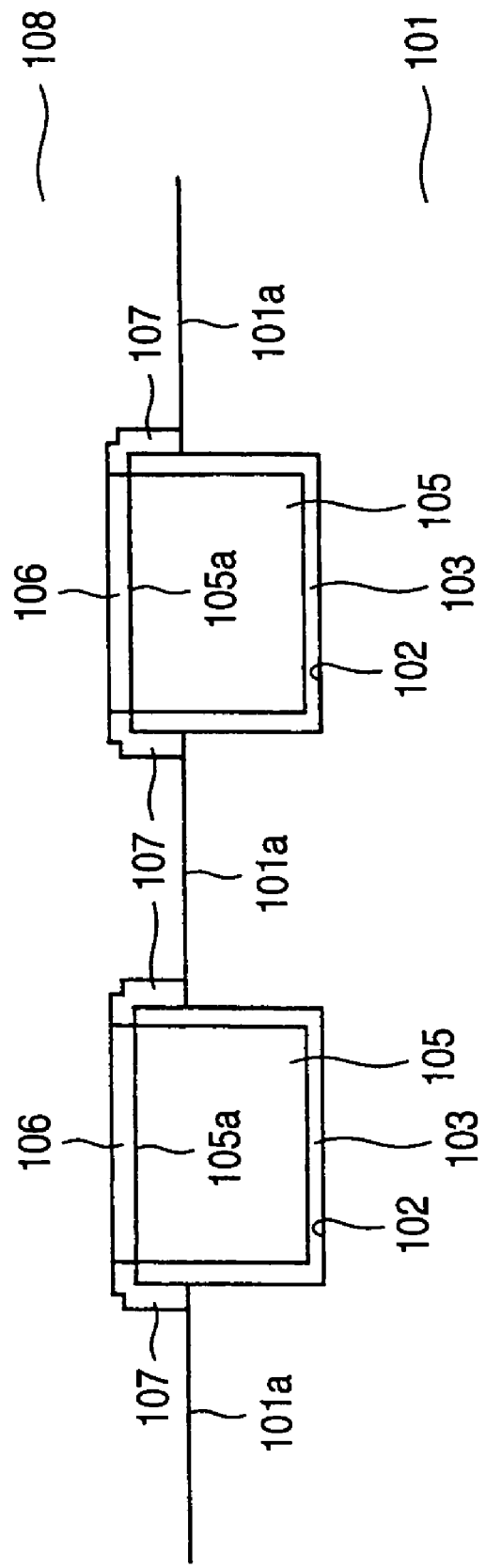
FIG. 11 is a view B describing the production method of the wiring structure according to the second embodiment.

FIG. 11 is a section view of a wiring structure 1 according to the second embodiment of the invention. In this wiring structure 1, the cap film 107 is separated for each of the grooves 102 and formed on respective sides of the cap films 106 and the barrier films 103 in the wiring structure 1 according to the first embodiment. More specifically, the wiring structure 1 has the insulating film 101, the plural barrier films 103, the plural wiring films 105 comprising the cupper Cu or the copper alloy, the first cap films 106 comprising the metal films containing the cobalt Co as the main component such as $Co_xW_yP_z$, Co, or $Co_xMo_yP_z$, or the metal films containing the nickel Ni as the main component such as $Ni_xW_yP_z$, or $Ni_xMo_yP_z$, and the second cap films 107 comprising the insulator containing $Si_xN_y$, $Si_xO_yN_z$, or $Si_xC_y$ as the main component.

The plural grooves 102 (grooves for wiring) are formed on the surface of the insulating film 101. The insulating film 101 has the boundary faces 101a as the horizontal tops among the adjacent grooves 102. The wiring films 105 are formed for each of the grooves 102 on the insulating film 101. The wiring films 105 are formed protrusively above the boundary faces 101a of the insulating film 101 in a convex pattern, or the boundary faces 105a of the wiring films 105 are positioned above the boundary faces 101a. Therefore, the edges of the tops 105a of the wiring films 105 are separated vertically from the boundary faces 101a. The barrier films 103 are formed on the bottoms of the wiring films 105 and up to a higher position than the boundary faces 101a on the sides of the wiring films 105. The cap films 106 are formed selectively-on the tops 105a of the wiring films 105. The cap films 107 are removed from the tops of the cap films 106 and from the surfaces of the insulating film 101, and formed only on respective sides of the cap films 106 and the barrier films 103. A second insulating film 108 is formed on the cap films 107.

Production Method

FIG. 11 to FIG. 12 are views for describing a production method of the wiring structure 1 according to the second embodiment.

Figure 10:
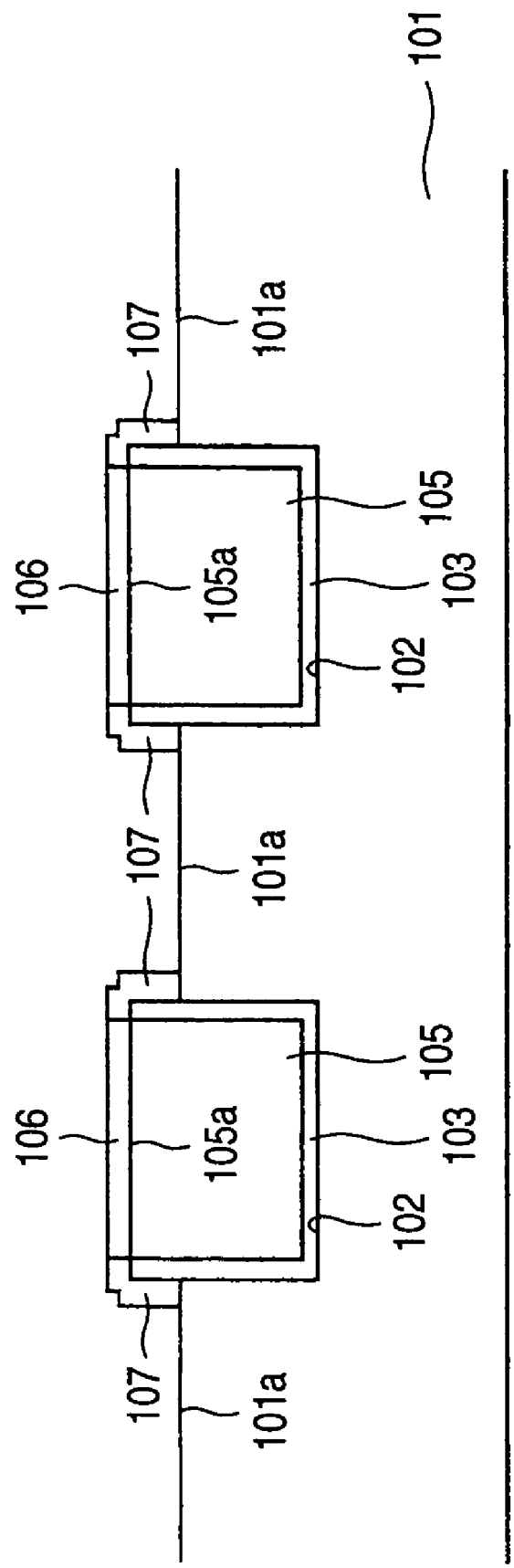
FIG. 10 is a view A describing a production method of a wiring structure according to the second embodiment.

After the processes from FIG. 1 to FIG. 8 in the first embodiment are finished, as shown in FIG. 10, the second cap film 107 comprising the silicon nitride $Si_xN_y$ is subjected to an etching back process until the boundary faces 101a of the insulating film 101 are exposed. From this, the second cap film 107 on the tops of the first cap films 106 and the second cap film 107 on the boundary faces 101a of the insulating film 101 are removed, thereby the second cap film 107 is separated for each of the grooves 102, and the second cap films 107 are left on respective sides of the first cap films 106 and the barrier films 103. At that time, although the tops of the first cap films 106 are exposed, the first cap films 106 are the metal films containing cobalt Co as the main component or metal films containing nickel Ni as the main component as described before, those metal films being hardly oxidized. Etching conditions are, for example, a gas flow rate of $CHF_3/O_2/Ar=30/2/150$ sccm, a chamber pressure of 30 mTorr, and an RF power of 800 W. Next, as shown in FIG. 11, the insulating film 108 comprising the silicon oxide $SiO_2$ is deposited 700 nm in thickness using the CVD method.

When the cap film 107 is separated for each of the grooves 102 using the etching back process as in the embodiment, the cap film 107 can be formed using a conductive material including a metal film containing tantalum as the main component such as Ta, $Ta_xN_y$, or $Ta_xSi_yN_z$, a metal film containing titanium as the main component such as $Ti_xN_y$ or $Ti_xSi_yN_z$, or a metal film containing tungsten as the main component such as WN or $W_xSi_yN_z$. In this way, when the cap films 107 are formed using the conductive material containing the metal, adhesiveness between the second cap films 107 and the first cap films 106 and between the second cap films 107 and the barrier films 103 is improved, in addition, the effect of restraining the Cu diffusion (diffusion of the Cu ions and spreading of the Cu hillocks) is improved.

Operational Advantages

Again in this embodiment, since the edges of the tops 105a of the wiring films 105 that are the leakage sources of the Cu ions or the Cu hillocks are spaced vertically from the boundary faces 101a of the insulating film 101 that are the leakage current paths, the Cu ions or the Cu hillocks hardly reach the boundary faces 101a of the insulating film from the edges of the tops 105a of the wiring films 105. Further, since the tops 105a of the wiring films 105 are covered by the cap films 106 comprising the metal film, adhesiveness at the boundary faces between the wiring films 105 and the cap films 106 or at the tops 105a of the wiring films 105 is high, thereby the electro migration can be restrained at the tops 105a of the wiring films 105. Moreover, since respective sides of the wiring films 105 and the barrier films 103 are covered by the second cap films 107 having a large insulating effect, the interconnect leakage current among the adjacent wirings can be restrained, resulting in improvement of the dielectric interconnect tolerance.

When the second cap film 107 is formed on an entire surface using a material having a high relative permittivity, increase of interconnect capacitance is problem. Particularly, in a multilayer wiring structure, the interlayer interconnect capacitance may increase and cause the signal delay. On the other hand, when the second cap film 107 is separated for each of the grooves 102 as in the embodiment, the whole relative permittivity of the cap films 107 that are an interlayer insulating material and the insulating film 108, or effective relative permittivity can be reduced, therefore the interlayer interconnect capacitance can be restrained. Particularly, when the cap films 107 are formed using $Si_xN_y$ having the relative permittivity of 7.0, since the permittivity is significantly large compared with the insulating film 108 that is formed using the silicon oxide $SiO_2$ having the relative permittivity of 4.2, the interlayer interconnect capacitance can be significantly reduced by decreasing volume of the cap films 107 having the high relative permittivity.

In some cases, fluorine-doped $SiO_2$ having a low relative permittivity (FSG film having a relative permittivity of about 3.5) is used as the material for the insulating film 108 to reduce the interconnect capacitance. Since influence of the cap film on the effective permittivity increases as the relative permittivity of the insulating film 108 decreases, the configuration where the cap film is separated for each of the grooves 102 as shown in the embodiment is effective for reduction of the effective permittivity.

The cap films 106 comprising $Co_xW_yP_z$ are hardly deposited on the barrier films 103, and thus entering of oxygen may occur at the edges of the tops 105a of the wiring films 105 that are boundaries with the barrier films 103, however, the edges of the tops 105a of the wiring films 105 are covered by the second cap films 107, thereby the oxidization of the wiring films 105 from the edges of the tops 105a can be prevented.

What is claimed is:

1. A wiring structure of a semiconductor device comprising,
    a first insulating film having plural grooves,
    plural wiring films formed such that the films are protruded above tops of the first insulating film among the grooves,
    plural barrier films formed on bottoms of the wiring films and up to a higher position than the tops on sides of the wiring films,
    first cap films comprising metal films formed on tops of the wiring films, and
    a second cap film formed on at least respective sides of the first cap films and the barrier films.

2. The wiring structure of the semiconductor device according to claim 1 wherein the first cap films are formed by electroless plating.

3. The wiring structure of the semiconductor device according to claim 2 wherein the first cap films are metal films containing Co or Ni as a main component.

4. The wiring structure of the semiconductor device according to claim 3 wherein the wiring films are metal films of Cu or metal films containing Cu as a main component.

5. The wiring structure of the semiconductor device according to claim 1 wherein the second cap film is formed on an entire surface extending from tops of the first cap films to the tops of the first insulating film.

6. The wiring structure of the semiconductor device according to claim 5 wherein the second cap film is an insulating film of $Si_xN_y$, $Si_xO_yN_z$, or $Si_xC_y$, or an insulating film containing $Si_xC_y$ as the main component.

7. The wiring structure of the semiconductor device according to claim 1 wherein the second cap film is formed separately for each of the grooves.

8. The wiring structure of the semiconductor device according to claim 7 wherein the second cap film is formed only on respective sides of the first cap films and the barrier films.

9. The wiring structure of the semiconductor device according to claim 8 wherein the second cap film is an insulating film of $Si_xN_y$, $Si_xO_yN_z$, or $Si_xC_y$, or an insulating film containing $Si_xC_y$ as the main component.

10. The wiring structure of the semiconductor device according to claim 8 wherein the second cap film is a metal film comprising $Ta_xN_y$, Ta, or $Ta_xSi_yN_z$.

11. The wiring structure of the semiconductor device according to claim 8 wherein the second cap film is a metal film comprising $Ti_xN_y$ or $Ti_xSi_yN_z$.

12. The wiring structure of the semiconductor device according to claim 8 wherein the second cap film is a metal film comprising $W_xN_y$ or $W_xSi_yN_z$.

13. The wiring structure of the semiconductor device according to claim 1 wherein the barrier films are metal films comprising $Ta_xN_y$, Ta, or $Ta_xSi_yN_z$.

14. The wiring structure of the semiconductor device according to claim 1 wherein the barrier films are metal films comprising $Ti_xN_y$ or $Ti_xSi_yN_z$.

15. The wiring structure of the semiconductor device according to claim 1 wherein the barrier films are metal films comprising $W_xN_y$ or $W_xSi_yN_z$.

16. The wiring structure of the semiconductor device according to claim 1 wherein the wiring films are concaved with respect to the barrier films.

* * * * *